United States Patent
Bardelli et al.

(10) Patent No.: US 6,498,579 B2
(45) Date of Patent: Dec. 24, 2002

(54) SUCCESSIVE-APPROXIMATION ANALOG-DIGITAL CONVERTER AND RELATED OPERATING METHOD

(75) Inventors: Roberto Bardelli, Fino Mornasco (IT); Mario Tarantola, Bareggio (IT)

(73) Assignee: STMicroelectronics s.r.l., Agrate Brianza (IT)

( * ) Notice: Subject to any disclaimer, the term of this patent is extended or adjusted under 35 U.S.C. 154(b) by 0 days.

(21) Appl. No.: 09/838,090

(22) Filed: Apr. 18, 2001

(65) Prior Publication Data

US 2001/0038352 A1 Nov. 8, 2001

(30) Foreign Application Priority Data

Apr. 27, 2000 (EP) .............................................. 00830311

(51) Int. Cl.[7] ................................................ H03M 1/34
(52) U.S. Cl. ....................... 341/163; 341/118; 341/155; 341/161; 341/164
(58) Field of Search ................................ 341/118, 161, 341/163, 164, 155

(56) References Cited

U.S. PATENT DOCUMENTS

| 5,028,926 | A | * | 7/1991 | Tokuhiro | 341/155 |
| 5,119,097 | A | * | 6/1992 | Ohkura et al. | 341/154 |
| 5,184,131 | A | * | 2/1993 | Ikeda | 341/165 |
| 5,736,953 | A | * | 4/1998 | Yamaguchi | 341/163 |
| 5,870,052 | A | * | 2/1999 | Dedic et al. | 341/155 |
| 5,898,396 | A | * | 4/1999 | Shimomura et al. | 341/163 |
| 6,075,478 | A | * | 6/2000 | Abe | 341/155 |
| 6,094,154 | A | * | 7/2000 | Lee | 341/161 |
| 6,181,268 | B1 | * | 1/2001 | Miyake et al. | 341/161 |
| 6,300,889 | B1 | * | 10/2001 | Piasecki | 341/122 |

* cited by examiner

*Primary Examiner*—Michael Tokar
*Assistant Examiner*—Khai Nguyen
(74) *Attorney, Agent, or Firm*—Hogan & Hartson LLP

(57) ABSTRACT

A successive-approximation analog-digital converter including a logic control circuit timed by means of an external clock signal clock. The logic control circuit includes a register containing a first digital signal formed of N bits, which is the product of a first analog-digital conversion. The logic control circuit is suitable for producing a second digital signal formed of N bits through a second analog-digital conversion in N clock cycles. This analog-digital converter converts the second digital signal sent by the logic circuit to a second analog signal. A comparator compares the first analog signal with the second analog signal which has been input to the analog-digital converter. The converter includes a device which enables the increase of the first analog signal in output from the digital-analog converter and in input to the comparator by a preset value (Voffs) when the bit of the first digital signal which corresponds in position to the bit of the second digital signal which must be decided in a clock cycle is zero.

12 Claims, 2 Drawing Sheets

SUCCESSIVE-APPROXIMATION ANALOG-DIGITAL CONVERTER AND RELATED OPERATING METHOD

FIELD OF THE INVENTION

The present invention relates to a successive-approximation analog-digital converter.

BACKGROUND OF THE INVENTION

The use of analog-digital converters that use a successive approximation technique, that is in which an analog signal is converted into a digital signal at N bits in N clock cycles, is generally known in the technical field. The converter basically consists of a comparator, a digital-analog converter (DAC) and a digital control logic. The function of the digital control logic is to determine the value of each bit by a sequential mode based on the output of the comparator. The cycle of conversion starts by sampling the analog input signal that has to be converted; however if the input signal is slowly variable that is, basically a signal that has a variation less than the least significant bit (LSB) for the duration of a conversion, the sampling of the input signal can be avoided. Then the logic control circuit assumes that the most significant bit (MSB) is 1 and all the other bits 0. The digital signal is sent to the DAC which generates an analog signal, for example of 0.5 Vref, where Vref is a reference voltage, which is compared with the analog input signal already sampled. If the output of the comparator is high the digital control logic makes the MSB 1, otherwise if the output of the comparator is low the digital control logic makes the MSB 0. This completes the first step in the approximation sequence. At this point, the value of the most significant bit is known.

The approximation sequence continues another time sending a digital signal to the DAC, with the most significant bit at its indicated value, the second bit placed at 1 and all the other bits which have a value 0. The comparison between the input signal sampled and the output of the DAC is again made; if the output of the comparator is high, the second bit is placed at 1, otherwise the second bit is placed at 0. The process continues in this manner until all the bits of the digital signal have been determined by the successive approximation process and therefore the number of cycles required for the conversion of an analog signal in a word of N bits is N.

In the case in which it is necessary to convert slowly variable signals, that is such that they do not significantly vary between one conversion and the next one (basically a signal with a variation that is less than one LSB (the least significant bit) for the duration of one conversion), given that said signals can be affected by disturbances (for example, noise) which cause undesired rapid variations in given periods of time, the digital output signal from an analog-digital converter like the above mentioned one will present anomalies. In particular, if the slowly variable analog signals that present oscillation in correspondence with the transition threshold between the value of the digital signal and the value of the continuous signal are considered, said oscillations may cause anomalies in the systems that have to be controlled by the converted digital signal.

In view of the state of the technique described, the object of the present invention is to present a successive-approximation analog-digital converter which overcomes the above mentioned drawback.

SUMMARY OF THE INVENTION

According to the present invention, such object is reached by means of a successive-approximation analog-digital converter comprising a logic control circuit timed by an external clock signal, said control circuit being adapted to produce a digital signal formed of N bits through a second analog-digital conversion in N clock cycles; a digital-analog converter that converts said digital signal sent by said logic circuit to an analog signal; a comparator which compares said analog signal with an analog signal at the input of said analog-digital converter, characterized in that said logic control circuit comprises a register which contains a previous digital signal formed of N bits and obtained from a previous analog digital conversion and said analog-digital converter comprise a device which enables the increase of said analog signal in output from the digital-analog converter and in input to said comparator by a preset value when the bit of said previous digital signal which corresponds in position to the bit of said digital signal which has to be decided in a clock cycle is a zero.

Moreover, according to the present invention, a method for the conversion of an analog signal to a digital signal as described herein, can be made.

Thanks to the present invention it is possible to make a successive-approximation analog-digital converter which, by the addition of a hysteresis at the DAC output, permits the elimination of the anomalies presented by known successive-approximation analog-digital converters in case of conversion of a slowly variable signal which presents oscillations at the transition threshold between the value of the digital signal and the value of the continuous signal.

BRIEF DESCRIPTION OF THE DRAWINGS

The characteristics and the advantages of the present invention will appear evident from the following detailed description of an embodiment thereof, illustrated as non-limiting examples in the enclosed drawings, in which.

DETAILED DESCRIPTION

Figure 1:
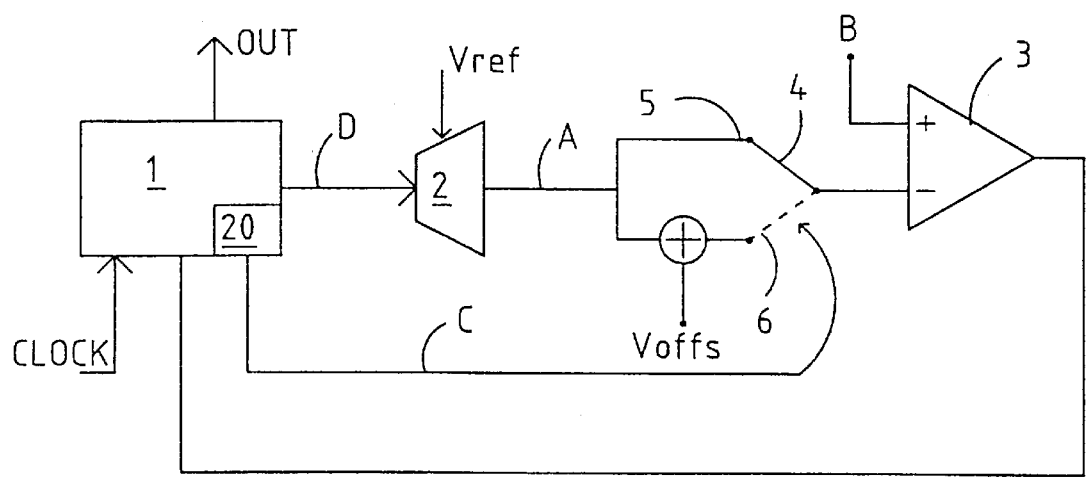
FIG. 1 is a principle diagram of a circuit according to the invention.

With reference to FIG. 1 a successive-approximation analog-digital converter is shown in which a logic control circuit 1 generates the digital signal D in input to a digital-analog converter (DAC) 2. The latter generates an analog signal A in input to a comparator 3 at its negative terminal; the comparator 3 compares said analog signal A with an analog signal B which represents the analog signal to convert that has already been sampled. The control circuit 1 is a timed logic control circuit as an external clock timing signal acts on it. Between the DAC 2 and the comparator 3 a switch 4 is provided which switches between the two possible states 5 and 6 so that the analog voltage signal A in input to the comparator 3 is the signal in output from the DAC 2 (in said case the switch 4 is in state 5) or the signal in output from the DAC 2 increased by a low value of voltage Voffs (with the switch 4 in the state 6). The switch 4 is controlled by a signal C coming from a control circuit 20 being part of the logic control circuit 1.

Figure 2:
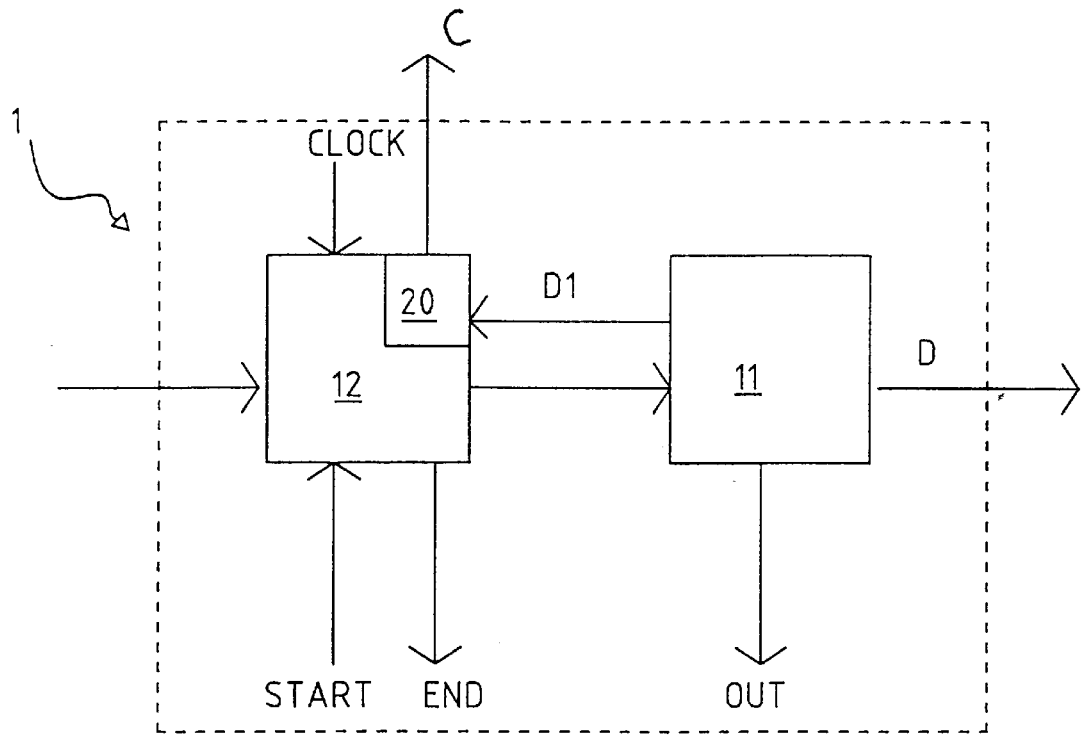
FIG. 2 is a more detailed diagram of block 1 of FIG. 1.

Generally a logic control circuit 1 for a successive-approximation analog-digital converter comprises an output register 11 and a digital circuit 12 on which the external clock signals act, start (start of conversion) and end (end of conversion), as can be seen in FIG. 2. The digital circuit 12 controls the register 11 and also the switch 4 given that it comprises also the control circuit 20. The latter, which has in input a digital signal D1 previously converted and contained in the register 11, makes switch 4 switch to position 6 only in the case in which in a clock cycle the bit of the digital signal D1 which corresponds in position to the bit of the digital signal D to convert is a zero. The operation of such a kind of converter follows.

If we presume that the number of the bits is N=3 we have a 3 bit successive-approximation converter with therefore 3 clock cycles. The digital signal D is formed of bits b0, b1, b2 and the register 11 contains the result of the previous conversion, that is the digital signal D1 formed of bits b0', b1', b2'. The logic control circuit 1 assumes that the bit b0 of the digital signal D is 1 and all the other bits (bits b1 and b2) 0. The digital signal D is sent to DAC 2 which generates the analog signal A, for example by 0.5 Vref, where Vref is a reference voltage in input at DAC 2. At this point if bit b0' of the digital signal D1 is 0 the control circuit 20, through the signal C commands the increase of the analog voltage signal A in output from the DAC 2 by the low Voffs voltage, by means of the switch 4 placed in position 6, otherwise if the bit b0' is 1 the analog signal A is left unaltered. The analog signal A is compared with the analog signal in input B. If the output of the comparator is high the logic control circuit 1 makes the MSB equal to 1; otherwise, if the output of the comparator is low, the logic control circuit 1 makes the MSB equal to 0. This completes the first stage of the approximation sequence that is a clock cycle. At this point the value of the most significant bit is known. The approximation sequence continues once again sending a digital signal D to the DAC 2, with the most significant bit b0 at its indicated value, the second bit b1 placed at 1 and the bit b2 placed at 0. At this point again if the bit b1' of the digital signal D1 is 0 the analog voltage signal A in output from the DAC 2 is increased by the low voltage Voffs; otherwise if the bit b1' is 1 the analog signal A is left unaltered. There is again the comparison between the signal in input B and the signal A; if the output of the comparator is high, the second bit is placed at 1, otherwise the second bit is placed at 0. At this point, the value of the second bit is also known. The approximation sequence continues once again sending a digital signal D to the DAC 2, with the bits b0 and b1 at their indicated values, and the bit b2 placed at 1. Again if the bit b2' of the digital word D1 is 0 the analog voltage signal A in output from the DAC 2 is increased by the low Voffs voltage otherwise if the bit b2' is 1 the analog signal A is left unaltered. Again there is the comparison between the signal in input B and signal A; if the output of the comparator is high, the third bit is placed at 1 otherwise the third bit is placed at 0. At the end of the process the signal D determines the digital signal out which is the output of the analog-digital converter.

Figure 3:
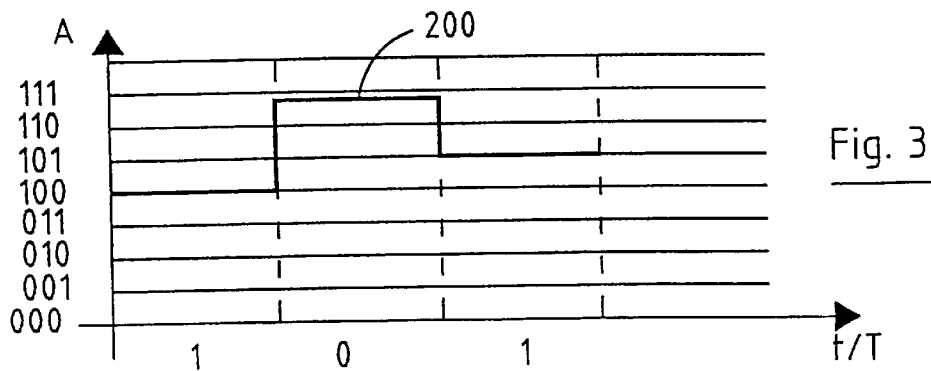
FIGS. 3 and 4 are time diagrams of the forms of voltage in output from the DAC in two different cases.
Figure 4:
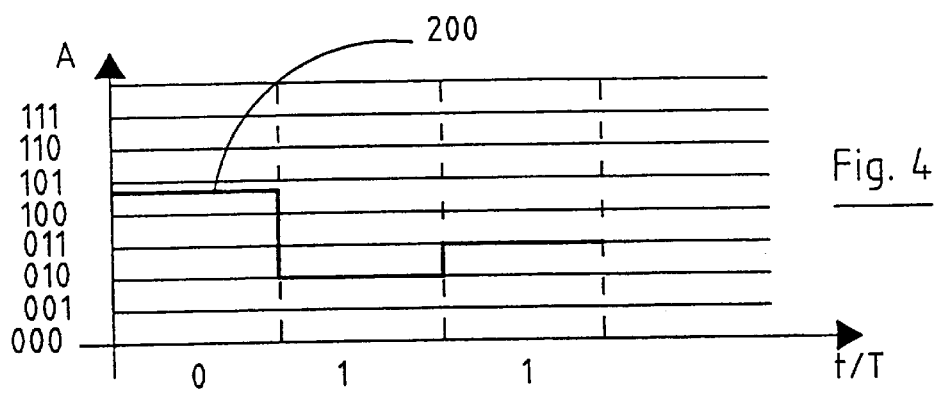

In the graphs of FIGS. 3 and 4, the examples are shown of the signals of voltage A in input to the comparator 3 in the case of digital signal D 101 and digital signal D 011 with the corresponding digital signals D 101 and 011 which are placed on the x-coordinate in the graphs of FIGS. 3 and 4. In FIGS. 3 and 4 the variation of the voltage signal A is shown in relation to time t/T with T clock period and it can be seen how the voltage signal A is increased by the low voltage Voffs each time the bit of the digital signal D1 which corresponds in position to the bit of the digital signal D is 0. The increase in the voltage signal A by the low voltage Voffs creates a hysteresis of voltage 200 which enables the elimination of the anomalies presented by the analog-digital successive approximation converters known in the case of conversion of a slowly variable signal which presents oscillations at the transition threshold between the value of the digital signal and the value of the contiguous signal. Generally said value of the voltage Voffs is less than the value of voltage of conversion of one least significant bit (LSB).

Figure 5:
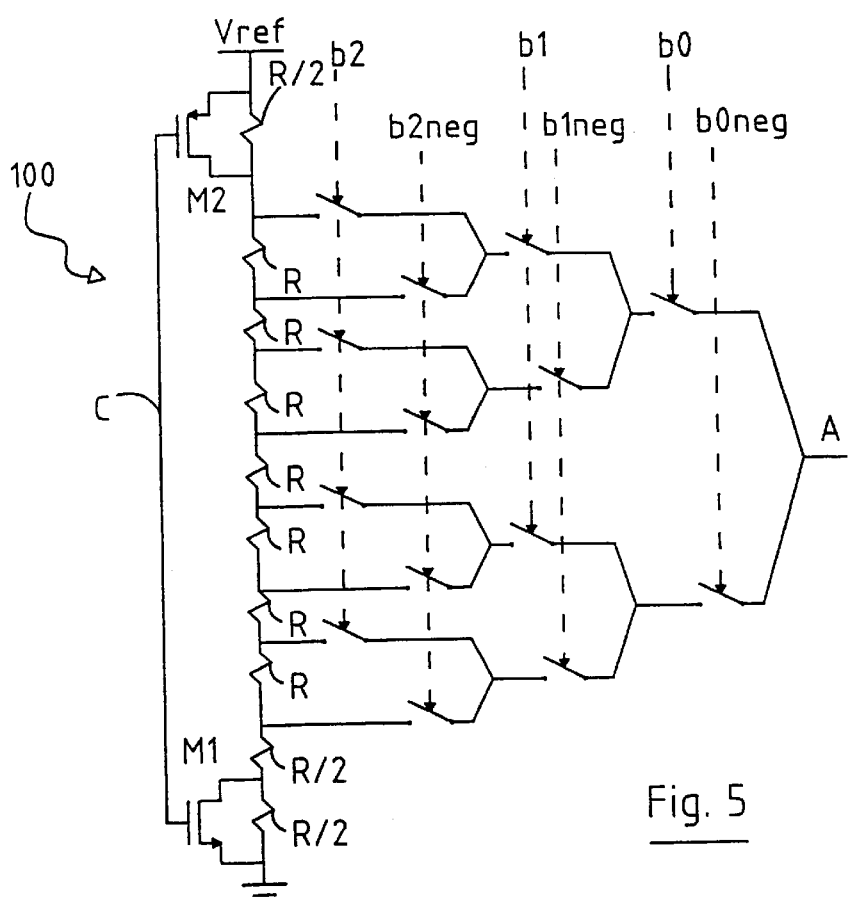
FIG. 5 shows in more detail the implementation of a DAC for the circuit in FIG. 1.

A possible implementation of the DAC 2 and the switch 4, in the case of a three bit analog-digital converter, is shown in FIG. 5. The circuit 100 of FIG. 5 consists of an n-channel transistor MOS M1 and of a p-channel transistor MOS M2 both controlled by the signal C and of a common resistive string DAC with resistances R and R/2 and switches controlled by signals b0–b2 and b0neg–b2neg which represent the value and the negation of the bit which compose the digital signal D in input to the DAC 2. The signal C, which is generally high when closing M1 and opening M2, in the case in which the voltage signal A in output to the circuit 100 must be increased by a Voffs voltage, becomes low causing the opening of M1 and the closing of M2. In this latter case, the voltage signal A in output will be increased by Vref/16 which therefore represents the voltage Voffs.

We claim:

1. Successive-approximation analog-digital converter comprising a control logic circuit timed by means of an external clock signal, said control circuit being suitable for producing a digital signal formed of N bits by means of an analog-digital conversion in N clock cycles, a digital-analog converter which converts said digital signal sent by said logic circuit to an analog signal with an analog signal which is in input to said analog-digital converter, characterized in that said logic control circuit comprises a register which contains a previous analog-digital conversion and said converter comprises a device which enables the increase of said analog signal in output from the digital-analog converter and in input to said comparator by a preset value when the bit of said previous digital signal which corresponds in position to the bit of said digital signal which must be decided in a clock cycle is zero.

2. The converter according to claim 1, wherein said device comprises a control circuit and a switch which is switchable by said control circuit to two possible states for the addition or not of said preset value to said analog signal.

3. The converter according to claim 1, wherein said analog signal in output from the digital analog converter and said input analog signal are voltage signals.

4. The converter according to claim 1, wherein said preset value is substantially less than a conversion value of a least significant bit.

5. Method for converting an analog signal into a digital signal at N bits in N clock cycles by means of a successive approximation analog-digital converter, said converter comprising a logic control circuit timed by means of an external clock signal, said control circuit being suitable for producing a digital signal formed of N bits through a second analog-digital conversion in N clock cycles, a digital-analog converter which converts said digital signal sent by said logic circuit to an analog signal, a comparator which compares said analog signal with an analog signal which is in input to said analog digital converter, characterized in that said logic control circuit comprising a register which contains a previous digital signal formed of N bits and obtained from a previous analog-digital conversion and that each of said clock cycles comprises a step in which the analog signal in output from said digital-analog converter and in input to said comparator is increased by a preset value if the bit of the previous digital signal corresponds in position to the bit of the digital signal which must be decided in said clock cycle is zero.

6. Method according to claim 5, characterized in that said increase of a preset value of said analog signal in output from said digital-analog converter and in input to said comparator is carried out through a device comprising a control circuit and a switch switchable to two possible states for the addition or not of said preset value to said analog signal through said control circuit.

7. The method for converting according to claim 5, wherein said analog signal in output from said digital-analog converter and said input analog signal are voltage signals.

8. The method for converting according to claim 5, wherein said preset value is substantially less than a conversion value of a least significant bit.

9. A circuit, comprising:
- a logic control circuit comprising a digital circuit and an outputs memory register, said outputs memory register being controllable by the digital circuit and storing a previous digital signal converted from a previous analog signal by said circuit, and wherein said logic control circuit being configured to produce a digital signal formed of N bits with an analog-digital conversion in N clock cycles;
- a converter connected to said logic control circuit for receiving said produced digital signal and, in response, outputting a corresponding analog signal; and
- a switch connected to said converter for receiving said analog signal and prior to outputting said analog signal, selectively increasing said received analog signal by a low value voltage, wherein said switch is operable based on a control signal from said digital circuit and wherein said control signal to increase said analog signal is transmitted by said digital circuit when in a clock cycle a bit of said stored previous digital signal which corresponds in position to a bit of said produced digital signal is zero.

10. The circuit of claim 9, further comprising a comparator for comparing said analog signal output by said switch with an input analog signal and in response, outputting a signal to said logic control circuit, wherein said analog signals and said input signals are voltage signals.

11. The circuit of claim 10, wherein said logic control circuit produces said digital signal based on said output signal of said comparator.

12. The circuit of claim 11, wherein said logic control circuit produces an output digital signal based on said digital signal produced after said N clock cycles.

* * * * *